United States Patent
Harari et al.

(10) Patent No.: US 6,897,522 B2
(45) Date of Patent: May 24, 2005

(54) MULTI-STATE NON-VOLATILE INTEGRATED CIRCUIT MEMORY SYSTEMS THAT EMPLOY DIELECTRIC STORAGE ELEMENTS

(75) Inventors: Eliyahou Harari, Los Gatos, CA (US); George Samachisa, San Jose, CA (US); Jack H. Yuan, Cupertino, CA (US); Daniel C. Guterman, Fremont, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/002,696

(22) Filed: Oct. 31, 2001

(65) Prior Publication Data

US 2003/0082871 A1 May 1, 2003

(51) Int. Cl.⁷ ............................................. H01L 29/792
(52) U.S. Cl. ....................................... 257/324; 257/326
(58) Field of Search .................................. 257/324, 326

(56) References Cited

U.S. PATENT DOCUMENTS

| | | | |
|---|---|---|---|
| 3,979,582 A | 9/1976 | Mims | |
| 4,057,788 A | 11/1977 | Sage | |
| 4,112,507 A | 9/1978 | White et al. | |
| 4,173,766 A | 11/1979 | Hayes | |
| 4,398,248 A | 8/1983 | Hsia et al. | |
| 4,527,257 A | 7/1985 | Cricchi | |
| 4,622,656 A | 11/1986 | Kamiya et al. | |
| 4,870,470 A | 9/1989 | Bass, Jr. et al. | |
| 5,043,940 A | 8/1991 | Harari | |
| 5,070,032 A | 12/1991 | Yuan et al. | |
| 5,095,344 A | 3/1992 | Harari | |
| 5,168,334 A | 12/1992 | Mitchell et al. | |
| 5,172,338 A | 12/1992 | Mehrotra et al. | |
| 5,278,439 A | * 1/1994 | Ma et al. ..................... | 257/315 |
| 5,311,049 A | 5/1994 | Tsuruta | |
| 5,313,421 A | 5/1994 | Guterman et al. | |
| 5,315,541 A | 5/1994 | Harari et al. | |

(Continued)

FOREIGN PATENT DOCUMENTS

| | | |
|---|---|---|
| EP | 1 073 120 A2 | 1/2001 |
| EP | 1 091 418 A2 | 4/2001 |
| EP | 1 096 505 A1 | 5/2001 |
| JP | 58-102394 | 6/1983 |
| JP | 11224940 | 8/1999 |
| SU | 960953 A | 9/1982 |
| WO | WO01/13378 A1 | 2/2001 |
| WO | WO03/015173 A2 | 2/2003 |

OTHER PUBLICATIONS

DiMaria, D J "Insulator Physics and Engineering : Electrically–Alterable Read–Only–Memory Applications", Oct. 1981, Journal De Physique, C4, No. 10, Tome 42, pp. C4–1115–21.*

Aritome S et al "A Novel Side Wall Transfer–Transistor Cell (Swatt Cell) for Multi–Level Nand EEPROMs", 1995, IEDM 95, pp 275–278.*

(Continued)

*Primary Examiner*—Howard Weiss
(74) *Attorney, Agent, or Firm*—Parsons Hsue & de Runtz LLP (57) ABSTRACT

Non-volatile memory cells store a level of charge corresponding to the data being stored in a dielectric material storage element that is sandwiched between a control gate and the semiconductor substrate surface over channel regions of the memory cells. More than two memory states are provided by one of more than two levels of charge being stored in a common region of the dielectric material. More than one such common region may be included in each cell. In one form, two such regions are provided adjacent source and drain diffusions in a cell that also includes a select transistor positioned between them.

30 Claims, 7 Drawing Sheets

U.S. PATENT DOCUMENTS

| | | | |
|---|---|---|---|
| 5,343,063 A | | 8/1994 | Yuan et al. |
| 5,424,978 A | * | 6/1995 | Wada et al. ............ 365/185.03 |
| 5,426,605 A | | 6/1995 | Van Berkel et al. |
| 5,436,481 A | | 7/1995 | Egawa et al. |
| 5,440,505 A | * | 8/1995 | Fazio et al. ............ 365/185.22 |
| 5,539,690 A | | 7/1996 | Talreja et al. |
| 5,172,338 A | | 7/1997 | Mehrotra et al. |
| 5,661,053 A | | 8/1997 | Yuan |
| 5,712,180 A | | 1/1998 | Guterman et al. |
| 5,768,192 A | | 6/1998 | Eitan |
| 5,824,584 A | | 10/1998 | Chen et al. |
| 5,851,881 A | | 12/1998 | Lin et al. |
| 5,887,145 A | | 3/1999 | Harari et al. |
| 5,889,303 A | * | 3/1999 | Eckert et al. ............... 257/316 |
| 5,912,844 A | | 6/1999 | Chen et al. |
| 5,946,231 A | | 8/1999 | Endoh et al. |
| 5,969,383 A | | 10/1999 | Chang et al. |
| 6,011,725 A | | 1/2000 | Eitan |
| 6,030,871 A | | 2/2000 | Eitan |
| 6,054,734 A | | 4/2000 | Aozasa et al. |
| 6,091,633 A | | 7/2000 | Cernea et al. |
| 6,101,125 A | | 8/2000 | Gorman |
| 6,103,573 A | | 8/2000 | Harari et al. |
| 6,104,072 A | | 8/2000 | Hirota ........................ 257/405 |
| 6,137,718 A | | 10/2000 | Reisinger |
| 6,151,248 A | | 11/2000 | Harari et al. |
| 6,177,318 B1 | | 1/2001 | Ogura et al. |
| 6,181,597 B1 | | 1/2001 | Nachumovsky |
| 6,201,282 B1 | | 3/2001 | Eitan |
| 6,215,148 B1 | | 4/2001 | Eitan |
| 6,215,702 B1 | | 4/2001 | Derhacobian et al. |
| 6,222,762 B1 | | 4/2001 | Guterman et al. |
| 6,248,633 B1 | | 6/2001 | Ogura et al. |
| 6,255,166 B1 | | 7/2001 | Ogura et al. |
| 6,266,281 B1 | | 7/2001 | Derhacobian et al. |
| 6,281,075 B1 | | 8/2001 | Yuan et al. |
| 6,313,503 B1 | | 11/2001 | Lee et al. |
| 6,331,952 B1 | | 12/2001 | Wang et al. |
| 6,331,953 B1 | | 12/2001 | Wang et al. |
| 6,346,725 B1 | * | 2/2002 | Ma et al. ..................... 257/316 |
| 6,349,062 B1 | | 2/2002 | Thurgate |
| 6,366,501 B1 | | 4/2002 | Thurgate et al. |
| 6,388,293 B1 | | 5/2002 | Ogura et al. |
| 6,399,441 B1 | | 6/2002 | Ogura et al. |
| 6,406,960 B1 | | 6/2002 | Hopper et al. |
| 6,413,821 B1 | | 7/2002 | Ebina et al. |
| 6,418,062 B1 | | 7/2002 | Hayashi et al. |
| 6,436,768 B1 | | 8/2002 | Yang et al. |
| 6,445,030 B1 | | 9/2002 | Wu et al. |
| 6,456,528 B1 | | 9/2002 | Chen |
| 6,459,622 B1 | | 10/2002 | Ogura et al. |
| 6,472,706 B2 | | 10/2002 | Widdershoven et al. |
| 6,477,088 B2 | | 11/2002 | Ogura et al. |
| 6,487,121 B1 | | 11/2002 | Thurgate et al. |
| 6,493,266 B1 | | 12/2002 | Yachareni et al. |
| 6,531,350 B2 | | 3/2003 | Satoh et al. |
| 6,531,732 B2 | | 3/2003 | Sugita et al. |
| 6,548,861 B2 | | 4/2003 | Palm et al. |
| 6,549,463 B2 | | 4/2003 | Ogura et al. |
| 6,552,387 B1 | | 4/2003 | Eitan |
| 6,555,865 B2 | | 4/2003 | Lee et al. |
| 6,580,120 B2 | | 6/2003 | Haspeslagh |
| 6,636,438 B2 | | 10/2003 | Ogura et al. |
| 6,670,240 B2 | | 12/2003 | Ogura et al. |
| 6,670,669 B1 | | 12/2003 | Kawamura |
| 6,677,200 B2 | | 1/2004 | Lee et al. |
| 6,709,922 B2 | | 3/2004 | Ebina et al. |
| 6,735,118 B2 | | 5/2004 | Ogura et al. |
| 2001/0021126 A1 | | 9/2001 | Lavi et al. |
| 2001/0055838 A1 | | 12/2001 | Walker et al. |
| 2002/0064911 A1 | | 5/2002 | Eitan |
| 2002/0105023 A1 | | 8/2002 | Kuo et al. |
| 2002/0118574 A1 | | 8/2002 | Gongwer et al. |
| 2002/0130350 A1 | | 9/2002 | Shin et al. |
| 2002/0196665 A1 | | 12/2002 | Kim |
| 2003/0016561 A1 | | 1/2003 | Lee et al. |
| 2003/0030097 A1 | | 2/2003 | Lee et al. |
| 2003/0057435 A1 | | 3/2003 | Walker |
| 2003/0080372 A1 | | 5/2003 | Mikolajick |
| 2003/0081456 A1 | | 5/2003 | Mikolajick |
| 2003/0081460 A1 | | 5/2003 | Choi et al. |
| 2003/0134476 A1 | | 7/2003 | Roizin et al. |
| 2003/0209754 A1 | | 11/2003 | Haspeslagh |
| 2004/0000688 A1 | | 1/2004 | Harari et al. |

OTHER PUBLICATIONS

K. T. Chang et al., "A new SONOS memory using source–side injection for programming," *IEEE Electron Device Lett.*, vol. 19, 1998, pp. 253–255.

P.J. Krick, "Three–state MNOS FET memory array," *IBM Technical Disclosure Bulletin*, vol. 18, No. 12, May 1976, pp. 1492–1493.

Takashi Hori et al., "A MOSFET with Si–implanted Gate–SiO,Insulator for Nonvolatile Memory Applications," *IEEE*, 0–7803–0817–4/92, pp. 17.7.1–17.7.4.

D. J. DiMaria et al., "Electrically–alterable read–only–memory using Si–rich SiO, injectors and a floating poly-crystalline silicon storage layer," *J. Appl. Phys.*, 52(7), Jul. 1981, pp. 4825–4842.

"Basic Programming Mechanisms," *Nonvolatile Semiconductor Memory Technology—A Comprehensive Guide to Understanding and Using NVSM Devices*, IEEE Press series on microelectronic systems, 1998, pp. 9–25.

Kamiya, M., et al., "EPROM Cell With High Gate Injection Efficiency," *International Electronic Devices Meeting of IEEE*, San Francisco, California, (Dec. 13–15, 1982) pps. 741–744.

Eitan et al., "NROM: A novel localized trapping, 2–bit nonvolatile memory cell," *IEEE Electron Device Letters*, vol. 21, No. 11, Nov. 2000, pp. 543–545.

Nozaki, "A 1–Mb EEPROM with a MONOS memory cell for a semi–conductor disk application," *IEEE Journal of Solid State Circuits*, vol. 26, No. 4, Apr. 1991, p. 498.

Chen et al., "A true single–transistor oxide–nitride–oxide EEPROM device," *IEEE Electron Device Letters*, vol. EDL–8, No. 3, Mar. 1987, pp. 93–95.

Chen, Wei–Ming et al., "A Novel Flash Memory Device with SPlit Gate Source Side Injection and ONO Charge Storage Stack (SPIN)", 1997 Symposium on VLSI Technology Digest of Technical Papers, pp. 63–64.

Roizin, Yakov, et al., "Novel Techniques for Data Retention and Leff Measurements in Two Bit *micro*FLASH® Memory Cells", AIP Conference Proceedings, vol. 550, Melville, New York, 2001, pp. 181–185.

Hsia, Yukun, "Memory Applications of the MNOS", Wescon Technical Papers, vol. 16, 1972, pp. 3303–3308.

Eitan et al., "Hot–Electron Injection into the Oxide in n–channel MOS Devices," *IEEE Transactions on Electron Devices*, vol. Ed–28, No. 3, Mar. 1981, pp. 328–340.

D. Frohman–Bentchkowsky, *Applied Physics Letters*, vol. 18, 1971, p. 332.

D. Frohman–Bentchkowsky, "FAMOS—A new semiconductor charge storage device," *Solid–State Electron*, 1974, vol. 17. p. 517.

Eitan et al., "Multilevel flash cells and their trade–offs," *IEDM Tech. Dig.*, 1996, pp. 169–172.

1. Fujiwara et al., "0.13 um MONOS single transistor memory cell with separated source lines," *IDEM Tech Dig.*, 1998, pp. 995–998.

Hayashi, Yutaka et al., "Twin MONOS Cell With Dual Control Gates", 2000 Symposium on VLSI Technology Digest of Technical Papers, pp. 122–123.

Notification of Transmittal of the International Search Report or the Declaration, corresponding PCT application No. PCT/US02/35132, International Searching Authority, Mar. 21, 2003, 4 pages.

S. Ogura et al., "Low Voltage, Low Current, High Speed Program Step Split Gate Cell With Ballistic Direct Injection for EEPROM/Flash", 1998, IEDM Technical Digest, 36.5, pp. 987–990.

F.I. Hampton et al., "Space Charge Distribution Limitation on Scale Down of MNOS Memory Devices", 1979, IEDM Technical Digest, pp. 374–377.

Eiichi Suzuki et al., "A Low–Voltage Alterable EEPROM With Metal–Oxide–Nitride–Oxide–Semiconductor (MONOS) Structures", IEEE Transactions on Electron Devices, vol. ED–30, No. 2, Feb, 1883, pp. 122–128.

Y. Tarui et al., "Electrically Reprogrammable Nonvolatile Semiconductor Memory", IEEE Journal of Solid State Circuits, vol, SC–7, No. 5, Oct. 1972, pp. 369–375.

Boaz Eitan et al., "Can NROM, a 2 Bit, Trapping Storage NMV Cell, Give a Real Challenge to Floating Gate Cells?", Extended Abstracts, 1999 Conference on Solid State Devices and Materials, Tokyo, 1999, pp. 522–524.

Krick, P.J., "Dual–Level Sense Scheme for Composite Insulator Memory Arrays", IBM technical Disclosure Bulletin, vol. 17, No. 6, Nov. 1974, pp. 1811–1813.

Lai, S.K. et al., "Comparison and Trends in Today's Dominant E2 Technologies", IEEE, IEDM 86, 1986, pp. 580–583.

Office Action dated Apr. 5, 2004, U.S. Patent and Trademark Office, Application No. 10/161,235, 19 pages.

Luc Haspeslagh, "Two Bit Non–Volatile Electrically Erasable and Programmable Memory Structure, a Process for Producing Said Memory Structure and Methods for Programming and Erasing Said Memory Structure", Provisional Application 60/296,618, filed Jun. 7, 2001, priority claimed by U.S. Appl. No. 6,580,120.

\* cited by examiner

FIG._1

(SECTION I-I)
FIG._2A

(SECTION II-II)
FIG._2B

(SECTION III-III)
FIG._8A (SECTION IV-IV)
FIG._8B

(SECTION V-V)
FIG._11A

(SECTION VI-VI)
FIG._11B

MULTI-STATE NON-VOLATILE INTEGRATED CIRCUIT MEMORY SYSTEMS THAT EMPLOY DIELECTRIC STORAGE ELEMENTS

FIELD OF THE INVENTION

This invention relates most specifically to non-volatile flash EEPROM (Electrically Erasable and Programmable Read Only Memory) cell arrays of a type using dielectric material charge storage elements.

BACKGROUND

There are many commercially successful non-volatile memory products being used today, particularly in the form of small cards, where the memory cells have conductive floating gates, commonly of doped polysilicon material, on which an electron charge is stored to a level of the data state being stored. A common form of such memory cells has a "split-channel" between source and drain diffusions. The floating gate of the cell is positioned over one portion of the channel and the word line (also referred to as a control gate) is positioned over the other channel portion as well as the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, and 5,661,053, and in co-pending U.S. patent application Ser. No. 09/239,073, filed Jan. 27, 1999, which patents and application are incorporated herein by this reference.

A modification of this split-channel flash EEPROM cell adds a steering gate positioned between the floating gate and the word line. Each steering gate of an array extends over one column of floating gates, perpendicular to the word line. The effect is relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). Further, such cells may operate with source side programming, having an advantage of lower programming currents and/or voltages. The use of steering gates in a flash EEPROM array is described in U.S. Pat. Nos. 5,313,421, 5,712,180, and 6,222,762, which patents are incorporated herein by this reference.

There are various programming techniques for injecting electrons from the substrate onto the floating gate through the gate dielectric. The most common programming mechanisms are described in a book edited by Brown and Brewer, "Nonvolatile Semiconductor Memory Technology," IEEE Press, section 1.2, pages 9–25 (1998), which section is incorporated herein by this reference. One technique, termed "Fowler-Nordheim tunneling" (section 1.2.1), causes electrons to tunnel through the floating gate dielectric under the influence of a high field that is established thereacross by a voltage difference between the control gate and the substrate channel. Another technique, termed channel "hot-electron injection" (section 1.2.3), injects electrons from the cell's channel into a region of the floating gate adjacent the cell's drain. Yet another technique, termed "source side injection" (section 1.2.4), controls the substrate surface electrical potential along the length of the memory cell channel in a manner to create conditions for electron injection in a region of the channel away from the drain. Source side injection is also described in an article by Kamiya et al., "EPROM Cell with High Gate Injection Efficiency," *IEDM Technical Digest*, 1982, pages 741–744, and in U.S. Pat. Nos. 4,622,656 and 5,313,421, which article and patents are incorporated herein by this reference.

Two techniques for removing charge from floating gates to erase memory cells are used in both of the two types of memory cell arrays described above. One is to erase to the substrate by applying appropriate voltages to the source, drain, substrate and other gate(s) that cause electrons to tunnel through a portion of a dielectric layer between the floating gate and the substrate.

The other erase technique transfers electrons from the floating gate to another gate through a tunnel dielectric layer positioned between them. In the first type of cell described above, a third gate is provided for that purpose. In the second type of cell described above, which already has three gates because of the use of a steering gate, the floating gate is erased to the word line, without the necessity to add a fourth gate. Although this later technique adds back a second function to be performed by the word line, these functions are performed at different times, thus avoiding the necessity of making compromises to accommodate the two functions.

It is continuously desired to increase the amount of digital data that can be stored in a given area of a silicon substrate, in order to increase the storage capacity of a given size memory card and other types packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, a cell with sixteen states stores four bits of data, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or of the overall array. Shrinking the size of integrated circuits is commonly performed for all types of circuits as processing techniques improve over time to permit implementing smaller feature sizes. But since there are limits of how far a given circuit layout can be shrunk by scaling through simple demagnification, efforts are so directed toward redesigning cells so that one or more features takes up less area.

In addition, different designs of memory cells have been implemented in order to further increase data storage density. An example is a dual floating gate memory cell, which can also be operated with the storage of multiple states on each floating gate. In this type of cell, two floating gates are included over its channel between source and drain diffusions with a select transistor in between them. A steering gate is included along each column of floating gates and a word line is provided thereover along each row of floating gates. When accessing a given floating gate for reading or programming, the steering gate over the other floating gate of the cell containing the floating gate of interest is raised sufficiently high to turn on the channel under the other floating gate no matter what charge level exists on it. This effectively eliminates the other floating gate as a factor in reading or programming the floating gate of interest in the same memory cell. For example, the amount of current flowing through the cell, which can be used to read its state, is then a function of the amount of charge on the floating gate of interest but not of the other floating gate in the same cell. An example of this cell array architecture, its manufacture and operating techniques are described in U.S. Pat. No. 5,712,180 (FIGS. 9+), which patent is incorporated herein by this reference (hereinafter referred to as the "Dual Storage Element Cell").

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," *IEEE Electron Device Letters*, Vol. EDL-8, No. 3, March 1987, pp. 93–95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," *IEEE Journal of Solid-State Circuits*, Vol. 26, No. 4, April 1991, pp. 497–501, which describes a similar cell in a split-gate configuration where a doped polysilicon gate extends over a portion of the memory cell channel to form a separate select transistor. The foregoing two articles are incorporated herein by this reference. The programming techniques mentioned above, by reference to section 1.2 of the book edited by Brown and Brewer, are also described in that section to be applicable to dielectric charge-trapping devices.

U.S. Pat. No. 5,851,881, incorporated herein by this reference, describes the use of two storage elements positioned adjacent each other over the channel of the memory cell, one being such a dielectric gate and the other a conductive floating gate. Two bits of data are stored, one in the dielectric and the other in the floating gate. The memory cell is programmed into one of four different threshold level combinations, representing one of four storage states, by programming each of the two gates into one of two different charge level ranges.

Another approach to storing two bits in each cell has been described by Eitan et al., "NROM: A Novel Localized Trapping, 2-Bit Nonvolatile Memory Cell," *IEEE Electron Device Letters*, vol. 21, no. 11, November 2000, pp. 543–545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

SUMMARY OF THE INVENTION

The present invention includes two primary aspects that may either be implemented together or separately. One primary aspect is directed to novel non-volatile memory cell structures that use dielectric charge storage elements rather than conductive floating gates. The other primary aspect is directed to the storage of charge in one of more than two detectable levels at one or more limited, contained regions across a dielectric charge storage element over a channel of a memory cell transistor. More than one bit of data is thereby stored in a single localized region of the dielectric over a portion of the channel. Two or more such independently programmable charge storage regions, spaced apart from each other along the length of the channel, may be provided in each memory cell of an array of such cells, wherein more than one bit of data is stored in each such region.

This invention can be implemented in a number of prior flash memory systems, such as those described above in the Background. Where a prior memory cell array utilizes conductive floating gates as storage elements, charge trapping dielectric material is substituted for the floating gates. The methods of making and operating such non-volatile memory systems with dielectric storage elements are quite similar to their conductive floating gate counterparts. Since charge does not move across a dielectric storage material, the dielectric may usually extend over most other areas of a memory cell array, across multiple rows and columns of memory cells. Where the memory cell includes a select transistor, however, gate dielectric is substituted within the select transistor for the electron storage material.

Two or more electron storage elements can be provided within the storage dielectric of each memory cell that has a gate structure allowing independent control of the electric potential across the substrate surface in respective two or more portions along the length of the memory cell channel. In the preferred implementations of the present invention, only one charge storage region is maintained within each such storage element. The enlargement or movement of a region of the dielectric into which electrons are injected, which can occur as the number of erase/programming cycles increases, thus does not affect an adjacent region within the same memory cell. This increases the number of erase/programming cycles that the memory can endure, thus increasing its effective life. This also makes it practical to store more than two memory states within each charge region since increased voltages, which are usually necessary to operate an enlarged window of charge that includes more than two charge levels defining multi-state storage, can also contribute to such enlargement or movement of the storage regions.

In a particular example, the Dual Storage Element Cell described above in the Background has charge-storing dielectric substituted for each of the two floating gates of the memory cells. This dielectric is sandwiched between conductive steering gates and the substrate to form two functionally separate charge storage elements over channels of the memory cells between their sources and drains. One region of charge is stored in each of these two storage elements, which lie along the length of the cell channels on opposite sides of the select transistors. The level of charge in a region affects the threshold level of the portion of the length of the cell channel beneath that region. Two or more such charge levels, and thus two or more different threshold levels, are defined for programming into each of the two charge storage regions of each memory cell. Programming and reading of a selected one of the two charge storage regions of an addressed cell is accomplished in the same manner as in the dual floating gate systems, by turning on the select transistor and driving the other channel portion strongly conductive. This renders the selected charge storage region of the addressed cell responsive to voltages placed on its source, drain and gates. Specific examples of Dual Storage Element Cell arrays in which the charge storage dielectric may be substituted for floating gates are given in U.S. Pat. Nos. 6,091,633, 6,103,573 and 6,151,248, and in pending applications Ser. No. 09/667,344, filed Sep. 22, 2000, by Yuan et al., entitled "Non-volatile Memory Cell Array having Discontinuous Source and Drain Diffusions Contacted by Continuous Bit Line Conductors and Methods of Forming," Ser. No. 09/925,134, filed Aug. 8, 2001, by Harari et al., entitled "Non-Volatile Memory Cells Utilizing Substrate Trenches," and Ser. No. 09/925,102, filed Aug. 8, 2001, by Yuan et al., entitled "Scalable Self-Aligned Dual Floating Gate Memory Cell Array and Methods of Forming the Array," which patents and patent applications are incorporated herein in their entirety by this reference.

Additional aspects, advantages and features of the present invention are included in the following description of its exemplary embodiments, which description should be read in conjunction with the accompanying drawings.

DESCRIPTION OF EXEMPLARY EMBODIMENTS

Several specific memory cell configurations are described with respect to the drawings. In each of them, charge is stored in at least one region of a charge trapping dielectric that is positioned between a conductive gate and the substrate. These memory cell examples may be operated either in a binary mode, where one bit of data is stored in each charge region, or in a multi-state mode, where more than one bit of data is stored in each region.

First Memory Cell Example (FIGS. 1–6)

Figure 1:
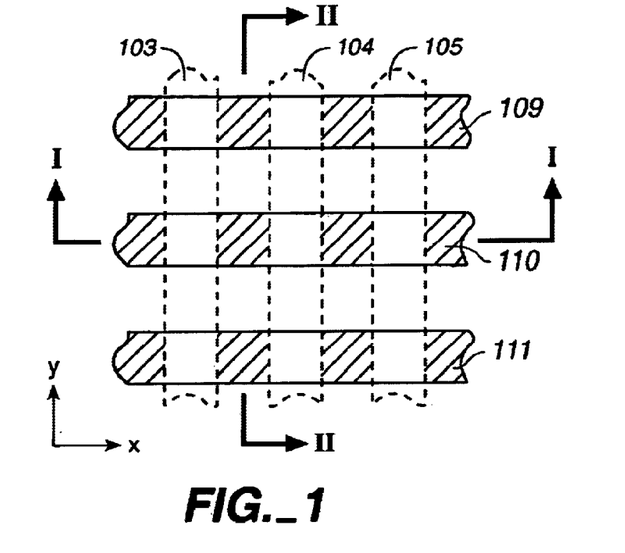
FIG. 1 shows a plan view of a first example of an array of memory cells.
Figure 2A:
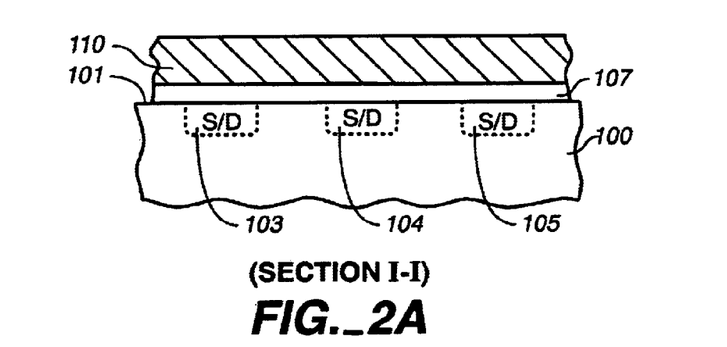
FIGS. 2A and 2B are cross-sectional views of the array of FIG. 1, taken at respective sections I—I and II—II.
Figure 2B:
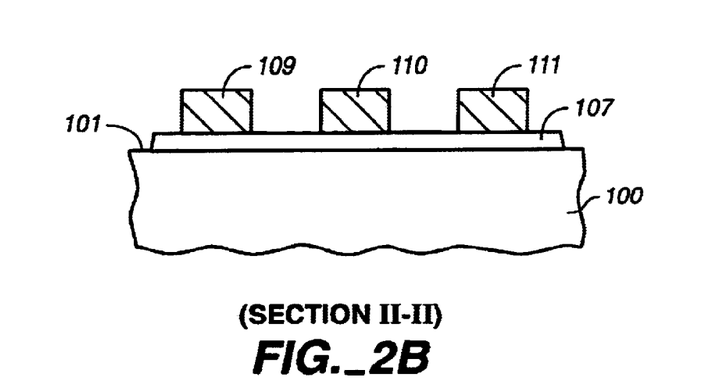

A few cells of a two-dimensional array of cells is illustrated in FIG. 1 in plan view, with orthogonal sections shown in FIGS. 2A and 2B. Elongated, parallel source and drain diffusions 103, 104 and 105 are formed in a surface 101 of a semiconductor substrate 100, with their lengths extending in the y-direction and are spaced apart in the x-direction. A dielectric layer 107 including a charge storage material is formed on the substrate surface 101. Elongated, parallel conductive control gates 109, 110 and 111 have lengths extending in the x-direction and are spaced apart in the y-direction. These gates can be made from doped polysilicon material, as is typical.

The charge storage elements of this simple structure (which is one of its advantages) are the areas of the dielectric layer 107 between the source and drain diffusions 103–105 and sandwiched between the control gates 109–111 and the substrate surface 101. These storage element areas are marked with cross-hatching in FIG. 1. The charge trapping material needs to be positioned only in these regions in order to form operable memory cells but may be extended over any other portions of the structure that is convenient, including over the entire memory cell array.

This memory cell array may be formed by standard processing techniques, particularly those developed for making flash EEPROM arrays of the type utilizing a floating gate. The major processing steps include forming an ion implant mask on the substrate surface through which ions are them implanted into the source and drain regions 103–105. This mask is then removed and the dielectric layer 107 is formed over the entire array. A layer of conductive material, such as doped polysilicon or polycide, is then deposited over the dielectric 107, an etch mask formed on its top surface and the polysilicon is then etched through the mask to leave the control gates 109–111. In the case of polysilicon, these control gates are doped in order to make them conductive by either initially depositing the polysilicon in a doped form or subsequently doping it by implanting ions before it is separated into the elongated strips 109–111. When the polysilicon is etched, the layer 107 in the regions being etched may also be removed, since those regions are unnecessary to the operation of the memory, to leave strips of the dielectric layer 107 under the control gates 109–111. Finally, another implant may be made into the substrate between the control gate strips 109–111, using the control gates as a mask, in order to increase the electrical isolation between adjacent rows of cells.

Figure 3:
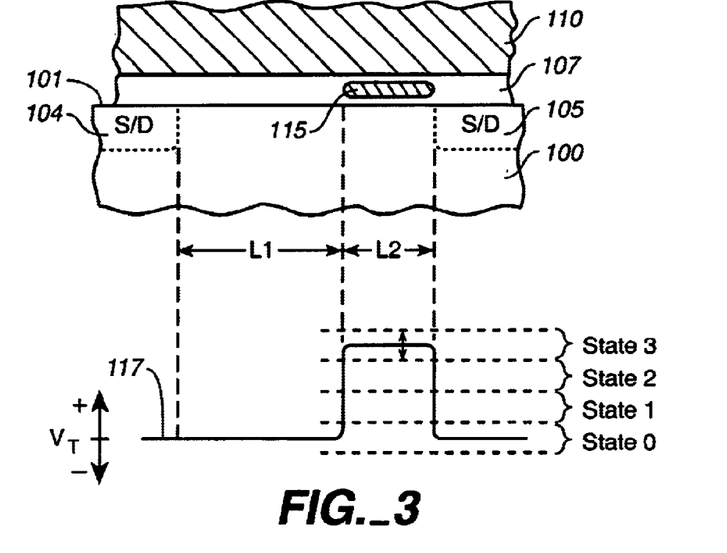
FIG. 3 is an enlarged view of the section of FIG. 2A, showing one memory cell, plus exemplary threshold voltage characteristics across that cell.

The programming and charge retention of such an array is illustrated in FIG. 3, where a portion of FIG. 2A including a single memory cell is enlarged. Programming is accomplished by the channel hot-electron injection technique described above in the Background. When appropriate voltages are placed on the substrate 100, source 104, drain 105 and control gate 110, electrons are accelerated within the cell channel from the source toward the drain sufficiently to be injected into a region 115 within the dielectric layer 107 adjacent the drain 105 and retained there. The actual programming voltages applied depend upon details of the array structure but the following are exemplary: Substrate 100: 0 volts; source 104: 0 volts; drain 105: 5 volts; and control gate 110: 8 volts.

The preferred programming technique follows that of flash EEPROMs with conductive floating gates, as described in references discussed above in the Background. Simultaneous pulses of these programming voltages are periodically applied to a number of cells in parallel and the programmed states of the cells are read in between programming pulses. When an individual cell reaches its programmed level, application of programming pulses to that cell is terminated. It will be noted that the source and drain diffusions are shared between cells in adjacent columns, and are operated in a virtual ground mode that is widely used in the operation of floating gate memory arrays.

The length of the channel of the memory cell of FIG. 3 is noted to have two components, "L1" for the portion of the length outside of the charge storage region 115, and "L2" for the portion of the length under the region 115. A curve 117 illustrates the threshold voltage ($V_T$) characteristics of the channel. The curve is flat along the channel length segment L1 at a level depending upon any threshold altering implant that may have been made in the substrate surface 101 and the impact of any prior channel erase operations (described hereinafter). The charge stored in the region 115 does not affect the threshold characteristics in the L1 segment. But in the L2 channel segment, the threshold is significantly affected by the stored charge, and, as in the floating gate counterpart systems, is the characteristic that is measured to determine the storage state of the cell.

Programming by Fowler-Nordheim tunneling through the layer of oxide formed on the channel region has its limitations. It can usually be used in only some specific memory array configurations, such as NAND and AND configurations. It is not practical to program this first example, or either of the second or third memory cell array examples described hereinafter, by this technique. But if programmed in this manner, the storage region within the dielectric 107 would extend substantially uniformly across the entire channel length (L1+L2) instead of being confined to the region 115.

Figure 4:
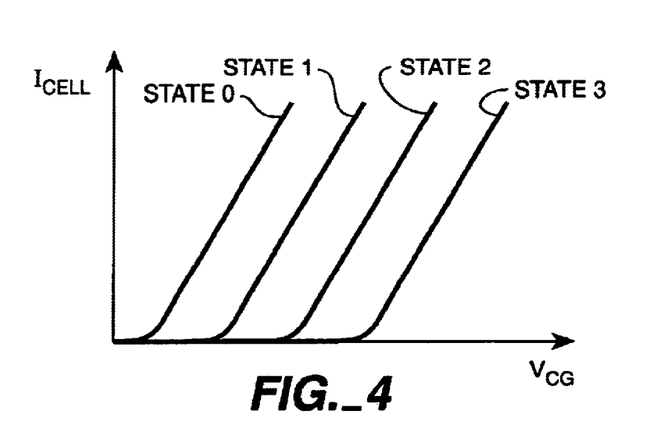
FIG. 4 is a set of exemplary current-voltage characteristic curves for the memory cell of FIG. 3 operated in four states.

Each cell may be operated in binary, to store one bit of data, by detecting whether $V_T$ is above or below one predetermined threshold level. But according to one primary aspect of the present invention, more than one bit of data may be stored in each cell by operating it to distinguish between more than two levels or ranges of $V_T$ that are separated by more than two predetermined threshold levels. A window of threshold levels in the L2 segment is shown in FIG. 3 to be divided into four states 0–3, as an example, which will store two bits per cell. More than four levels may alternatively be designated in order to store more than two bits per storage element. Exemplary current-voltage characteristics are shown in FIG. 4 for the cell of FIG. 3 in each of its four storage states as a result of an appropriate amount of charge being stored in the dielectric region 115. The quantity $V_{CG}$ along the x-axis of FIG. 4 is the voltage on the control gate 110 of the cell, and the quantity $I_{CELL}$ on the y-axis is the current through the channel of the cell.

Figure 5:
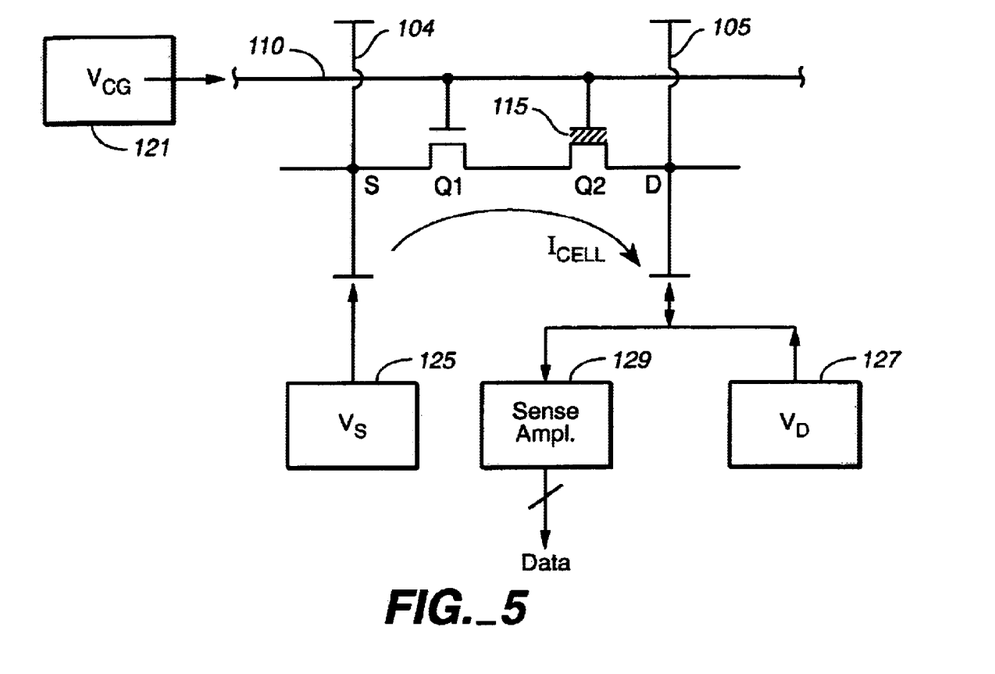
FIG. 5 is an equivalent electrical circuit of the memory cell shown in FIG. 3, plus schematic representations of some operating elements.

The memory cell shown in FIG. 3 is effectively a split-channel cell because the charge storage region 115 extends across only a portion of the channel. An electrical equivalent circuit of the cell is shown in FIG. 5, two transistors Q1 and Q2 being connected in series between adjacent source and drain diffusions 104 and 105 (bit lines). The transistor Q1 must be rendered conductive during programming or reading by providing a sufficient combination of voltages on the cell's elements. During read, a voltage source 121 ($V_{CG}$) is connected to the control gate 110 (word line), a voltage source 125 ($V_S$) to the diffusion 104 and a voltage source 127 ($V_D$) to the diffusion 105.

The cell of FIG. 3 can be read in the same manner as a cell having a conductive floating gate. There are two general ways. The control gate voltage $V_{CG}$ may be held fixed and the current through the cell ($I_{CELL}$) measured by a sense amplifier circuit 129 as an indication of the storage state of the cell. The actual voltages applied depend upon details of the array structure but the following are exemplary: Substrate 100: 0 volts; source 104: 0 volts; drain 105: 1 volts; and control gate 110: 3–5 volts. Alternatively, the control gate voltage $V_{CG}$ may be varied and its value noted when the value of the cell current is determined by the sense amplifier 129 to cross a fixed threshold. That voltage value gives an indication of the storage state of the cell. This example utilizes "forward" reading, since the drain during programming is also the drain during reading. Alternatively, the reading may be performed in a "reverse" mode, where the drain and source during programming are reversed during reading.

The diagram of FIG. 5 also contains the components used to program the cell, except that the sense amplifier 129 is typically not connected during programming. The voltage sources 121, 125 and 127 are connected as shown in FIG. 5 during programming but the values of the voltages supplied are different. A number of cells along at least one word line may be erased together by applying appropriate voltages to cause electrons to move from the dielectric charge trapping regions to the substrate. An example set of erase voltages is as follows: Substrate 100: 0 volts; source 104: floating; drain 105: 5 volts; and control gate 110: −8 volts.

Figure 6A:
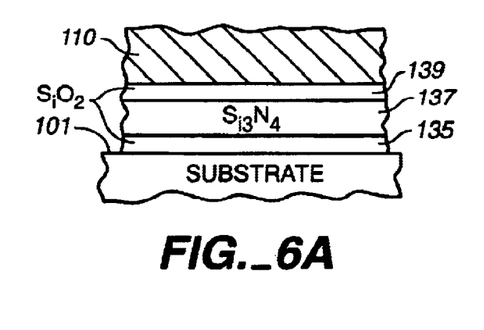
FIGS. 6A and 6B illustrate two different specific dielectric material configurations that may be used in memory cells for trapping charge.

FIG. 6 illustrates two exemplary structures for the charge storage dielectric layer 107 that may be used in all of the memory cell examples described herein. The first (FIG. 6A) includes a layer 135 of silicon oxide ($SiO_2$), commonly just called "oxide," grown on the substrate surface 101, followed by a layer 137 of silicon nitride ($Si_3N_4$), commonly just called "nitride," being deposited over the layer 135. A layer 139 of oxide is then grown on the nitride layer 137 or deposited on it, or a combination of the two. This oxide-nitride-oxide configuration is known as "ONO." Electrons are trapped and stored in the nitride layer 137. Exemplary thicknesses of these layers are as follows: layer 135: 50 Angstroms; layer 137: 70 Angstroms; and layer 139: 100 Angstroms. The layer of conductive material from which the control gates are formed is then deposited on the ONO layer.

Figure 6B:
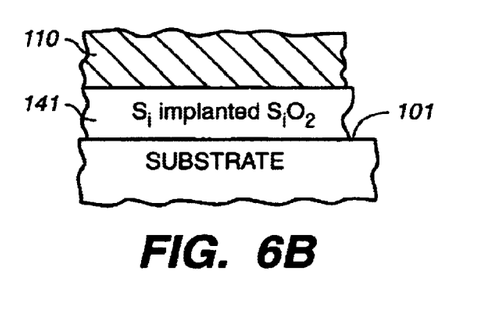

The second structure, shown in FIG. 6B, uses a tailored layer 141 of silicon rich silicon dioxide to trap and store electrons. Such material is described in the following two articles, which articles are incorporated herein in their entirety by this reference: DiMaria et al., "Electrically-alterable read-only-memory using Si-rich $SiO_2$ injectors and a floating polycrystalline silicon storage layer," *J. Appl. Phys.* 52(7), July 1981, pp. 4825–4842; Hori et al., "A MOSFET with Si-implanted Gate-$SiO_2$ Insulator for Non-volatile Memory Applications," IEDM 92, April 1992, pp. 469–472. As an example, the thickness of the layer 141 can be about 500 Angstroms.

Second Memory Cell Example

Figure 7:
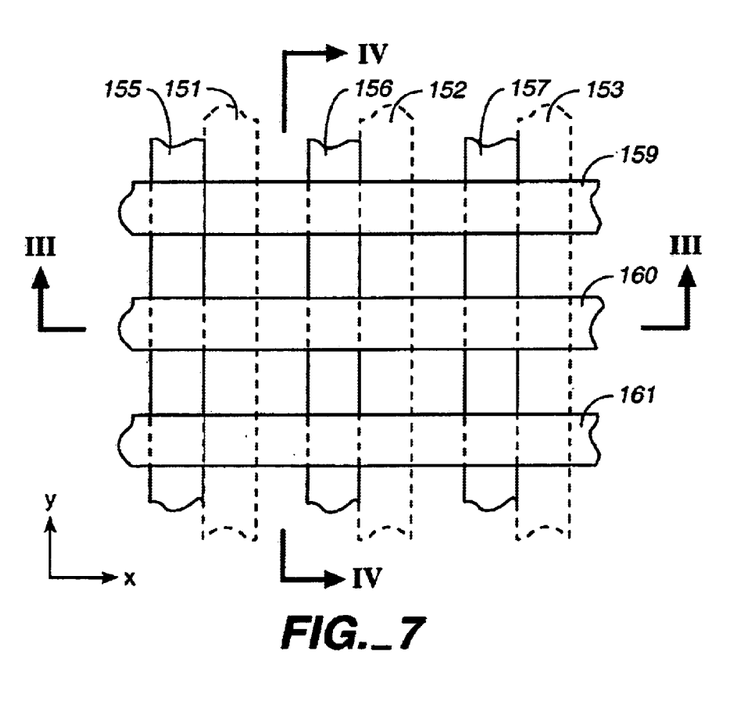
FIG. 7 shows a plan view of a second example of an array of memory cells.
Figure 8A:
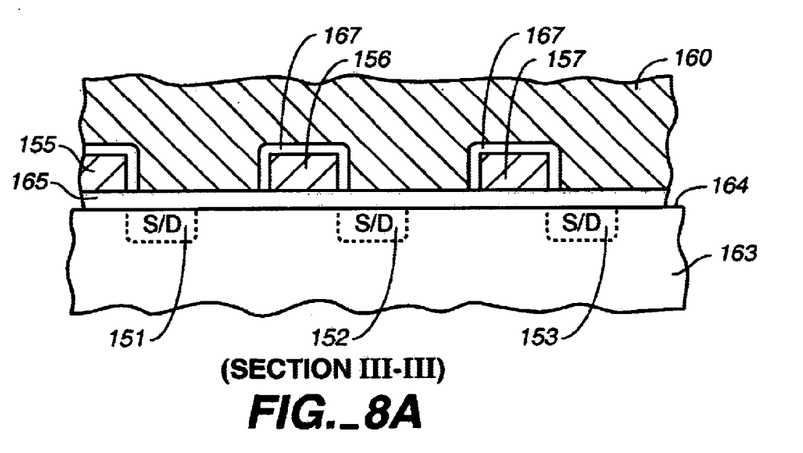
FIGS. 8A and 8B are cross-sectional views of the array of FIG. 7, taken at respective sections III—III and IV—IV.
Figure 8B:
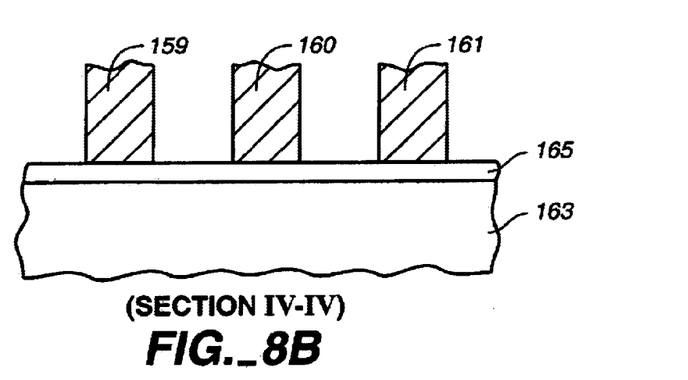
Figure 9:
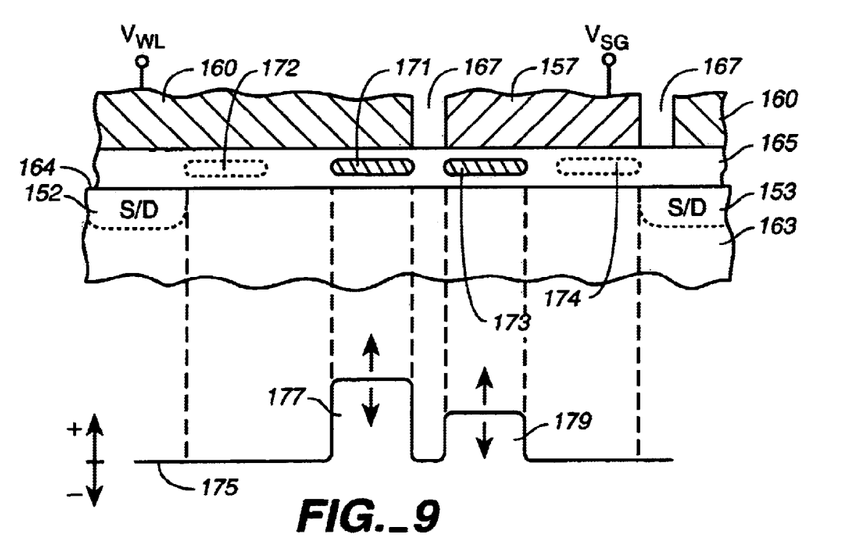
FIG. 9 is an enlarged view of the section of FIG. 8A, showing one memory cell, plus exemplary threshold voltage characteristics across that cell.

Another example memory array is illustrated in FIGS. 7–9, which differs from the first example by the use of two sets of orthogonally positioned conductive gates instead of just one set. FIG. 7 shows a few cells of the array in plan view and FIGS. 8A and 8B are cross-sectional views in two orthogonal directions. Parallel source and drain diffusions 151, 152 and 153, formed in a surface 164 of a substrate 163, are elongated in the y-direction across the array and spaced apart in the x-direction. Conductive control gates 155, 156 and 157, which may be referred to as steering gates, are also elongated in the y-direction and spaced apart in the x-direction. These gates are positioned alongside respective diffusions 151, 152 and 153. These diffusions are spaced further apart than those of the first example in order to allow for these control gates to be positioned across the memory cell channels. A second set of conductive control gates 159, 160 and 161, which form the word lines of the array, are elongated in the x-direction and spaced apart in the y-direction. The conductive gates are typically formed of doped polysilicon but may alternatively be formed of other low resistance materials.

Referring to the sectional views of FIGS. 8A and 8B, a layer of charge storing dielectric 165 is formed over the substrate surface 164 of the array. This dielectric can be one of the two specific dielectrics described above with respect to FIGS. 6A–B. Another dielectric layer 167 is formed between the two sets of conductive gates where they cross each other. This layer is made to be relatively thick in order to sustain the potential voltage differences between the two sets of gates, such as a 250 Angstroms thick oxide.

It will be noted from FIG. 8A, and the enlarged sectional view of one memory cell thereof in FIG. 9, that the length of the individual memory cell channels is divided into two portions that are field coupled with different ones of the two sets of control gates. The word line 160 lies over the left approximately one-half of the channel length and the control gate 157 over the other. The charge storing dielectric 165 is sandwiched between the substrate surface 164 and these gates. A primary difference in operation of this array from that of the first example is that charge may be stored in two spatially separated regions 171 and 173 within the layer 165, and each of these regions may be individually programmed and read independently of the other. Programming by source side injection is preferred, which causes the charge storage region 171 to be located adjacent an interior edge of the gate 160 and the charge storage region 173 adjacent an interior edge of the gate 157. However, if programmed by channel hot-electron injection, electrons are stored in regions 172 and 174 within the layer 165 instead of in the regions 171 and 173. The regions 172 and 174 are adjacent respective ones of the cell diffusions 152 and 153.

This example cell effectively contains two charge storage elements over its channel between adjacent source and drain regions 152 and 153, one under the conductive gate 160 and the other under the conductive gate 157. The dielectric layer 165 may be limited to these areas or, as is usually more convenient, extended over more of the array. FIGS. 7–9 show the charge storage layer 165 extending over the entire array.

A curve 175 of FIG. 9 illustrates the varying threshold voltage characteristics ($V_T$) across the cell's channel, when programmed in the regions 171 and 173 by source side injection. The amount of charge stored in the region 171 imparts a $V_T$ value 177 of the threshold under it, and the amount of charge stored in the region 173 imparts a $V_T$ value 179 of the threshold under it. Each of the threshold values 177 and 179 may be maintained in one of two storage states, where a single breakpoint threshold value is set between the states. Two bits of data are stored in each cell if this is done. Alternatively, each of the values 177 and 179 may be operated with more than two levels, as shown in FIG. 3 for the first example array. If each of the levels 177 and 179 is operated in four states, as shown in FIG. 3, a total of four bits of data are stored in each memory cell. Of course, if one or both portions of the channel are operated in more than four levels, more than four bits of data are stored in each cell. Also, if the cell is programmed by channel hot-electron injection instead of source side injection, the curve 175 is modified by the levels 177 and 179 being moved apart to positions under the charge storage regions 172 and 174.

Each of the threshold values 177 and 179 is preferably programmed and read independently of one another. One segment of the cell is turned on hard, thus eliminating any effect of its programmed threshold level, while the other is being programmed or read. Although the specific voltages applied to the array will depend upon its specific structure, the following are approximate voltages that might be used for programming the cell of FIG. 9 by channel hot-electron injection:

Programming the left segment, threshold value 177: Substrate 163: 0 volts; source 153: $V_S$=0 volts; drain 152: $V_D$=5 volts; control gate 157: $V_{SG}$=8 volts; and word line 160: $V_{WL}$=10 volts.

Programming the right segment, threshold value 179: Substrate 163: 0 volts; source 152: $V_S$=0 volts; drain 153: $V_D$=5 volts; control gate 157: $V_{SG}$=8 volts; and word line 160: $V_{WL}$=10 volts.

Programming is also preferably accomplished in this example by alternately pulsing a plurality of cells with these voltages in parallel and verifying their programmed states by reading them, the programming being terminated on a cell-by-cell basis after reaching the desired level, as done with floating gate flash memory gate arrays.

Exemplary reading voltages for the cell of FIG. 9, when programmed in the manner described above, are as follows:

Reading forward the left segment, threshold value 177 by sensing the value of the cell current $I_{CELL}$ at fixed voltages: Substrate 163: 0 volts; source 153: $V_S$=0 volts; drain 152: $V_D$=1 volt; control gate 157: $V_{SG}$=8 volts; and word line 160: $V_{WL}$=6 volts.

Reading forward the right segment, threshold value 179 by sensing the value of the cell current $I_{CELL}$ at fixed voltages: Substrate 163: 0 volts; source 152: $V_S$=0 volts; drain 153: $V_D$=1 volt; control gate 157: $V_{SG}$=6 volts; and word line 160: $V_{WL}$=8 volts.

Erasing of the memory cells is accomplished in this and the other two examples by the injection of holes into their charge trapping layers. These holes neutralize the negative charge of the electrons that were injected into the charge-trapping layer during a programming operation. It is the layer 165 in this second example (FIGS. 7–9) that receives the electrons during programming and the holes during erasing. There are two specific erasing techniques. In one, the holes are injected into a charge storage portion of the layer 165 from the silicon substrate by tunneling through an oxide portion of that layer that is in contact with the substrate surface, termed a "channel erase." To bring this about, a negative potential is applied to the word line with respect to the substrate, with the drain and source either being grounded or left floating. In the other technique, the holes are injected into the layer 165 from a region of the substrate near the drain or the source. In this second approach, referring to FIGS. 8 and 9, a combination of a negative voltage on both the word lines 159–161 and steering gates 155–157, and a positive voltage on the drains and sources 151–153, are applied. (In the cell shown in FIG. 3 for the first example previously described, a positive voltage is applied to the drain 105, the source 104 is left floating, and a negative voltage is applied to the word line 110.)

When cells have been programmed by source side injection, the channel erase technique is preferred. When programmed by the hot-electron injection technique, either of these two erasing techniques can be used. But when cells have been programmed by hot-electron injection, the channel erase has a disadvantage of tunneling holes across the entire channel, the result being an over erase of a portion of the charge trapping layer that does not contain electrons trapped by prior programming. This can cause the flat zero portions of the curve 175 (FIG. 9) across the cell channel to be lowered to negative threshold values.

To simultaneously erase a plurality of cells in a block of cells in this second example, the following voltages are simultaneously applied to individual cells: Substrate 163: 0 volts; source 152: $V_S$=5 volts; drain 153: $V_D$=5 volts; control gate 157: $V_{SG}$=−8 volts; and word line 160: $V_{WL}$=−8 volts. These voltages implement the second erase approach described above.

The memory cell array of FIGS. 7–9 may also be formed by standard processing techniques, particularly those developed for making flash EEPROM arrays of the type utilizing a floating gate. In one example process, the layer 165 is first formed over the entire substrate area of the memory cell array. A first layer of polysilicon is then deposited over this area and etched through an appropriate mask to leave the control gates 155–157. The layer 165 in between the control gates 155–157 is removed as part of this etching process, in one example. The source and drain regions 151, 152 and 153 are then implanted through a mask formed by the control gates and other temporary masking material (not shown), thus being self-aligned with one edge of the control gates 155–157. The layer 165 is then formed on the substrate surface 164 in between the control gates 155–157 and simultaneously over the top and sides of the control gates 155–157. This is a continuous layer of ONO (FIG. 6A) or silicon rich oxide (FIG. 6B). The layer 167 shown in FIGS. 8 and 9 can be part of the same layer 165 or a combination of the layer 165 and other dielectric material. Such other dielectric material can be in the form of oxide spacers (not shown) formed along the vertical walls of the control gates 155–157 and/or a thick oxide layer (not shown) on the top surface of the control gates 155–157. This top surface oxide is preferably formed by depositing the oxide on the top of the first polysilicon layer before it is separated into the gates 155–157. A second layer of polysilicon is then formed over this continuous layer, and is then etched into the word lines 159, 160 and 161.

It will be noted that this second example memory cell has a larger dimension in the x-direction by one resolution element than does the first example of FIGS. 1–3, because of the added control (steering) gates 155–157. A second polysilicon layer is also required in this second example. This added structure and size, however, allows the amount of data that is stored in each cell to be doubled.

A useful modification of the cell of FIGS. 7–9 for some purposes replaces the electron storage layer under the control gates 155–157 with a thin (such as 200 Angstroms thick) gate dielectric, usually an oxide grown on the substrate surface 164. This eliminates the second electron storage region 173 but adds an independent select transistor function to each cell. Erase can then be confined to individual rows of cells.

Third Memory Cell Example

In this example, shown in FIGS. 10–13, an array of Dual Storage Element Cells, described above in the Background, is provided with its conductive floating gates replaced by portions of one of the dielectric charge trapping material layers described above with respect to FIGS. 6A–6B. The making and operation of this array are similar to the arrays of Dual Storage Element Cells described in the patents and patent applications incorporated above into the Background and Summary.

Figure 10:
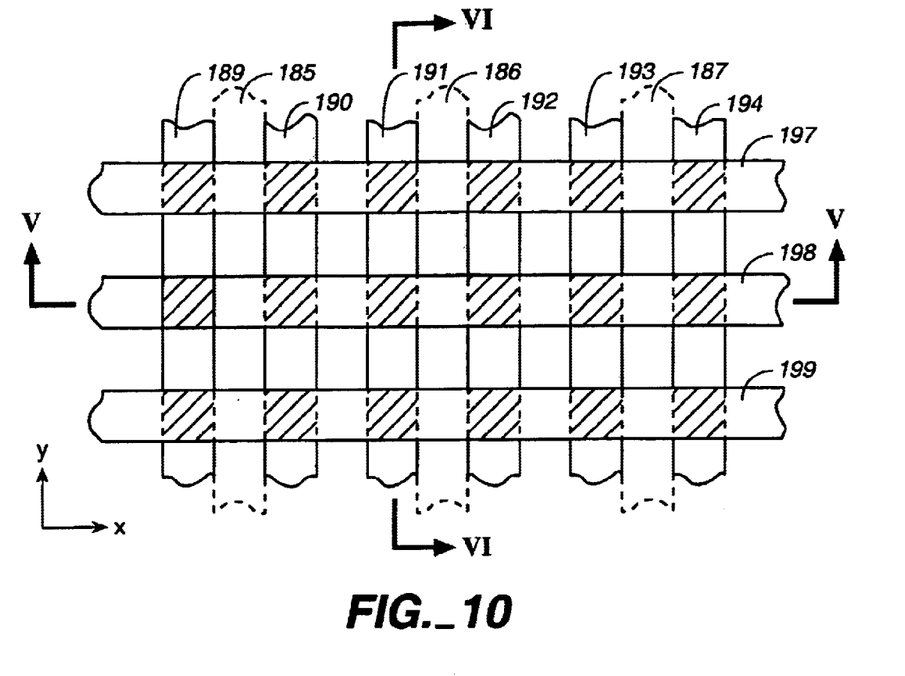
FIG. 10 shows a plan view of a third example of an array of memory cells.
Figure 11A:
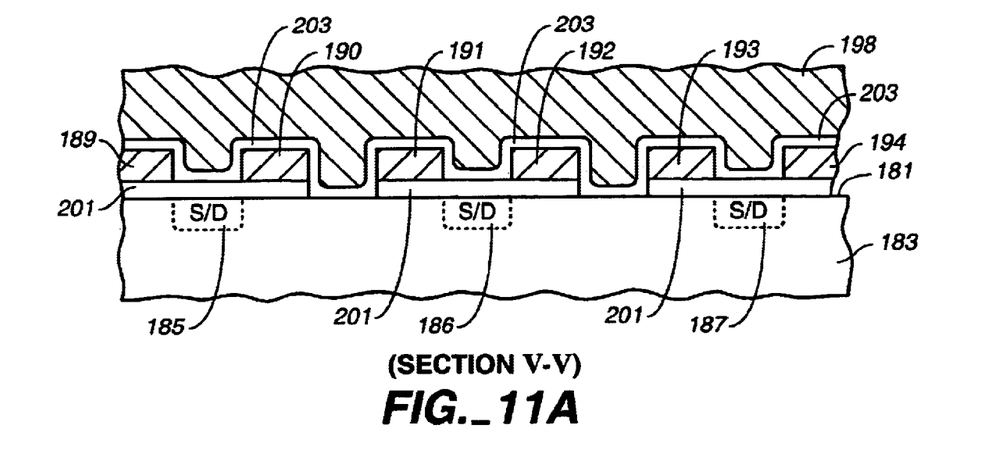
FIGS. 11A and 11B are cross-sectional views of the array of FIG. 10, taken at respective sections V—V and VI—VI.
Figure 11B:
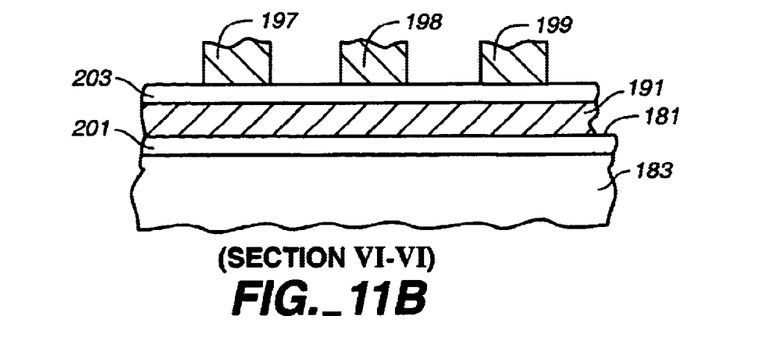
Figure 12:
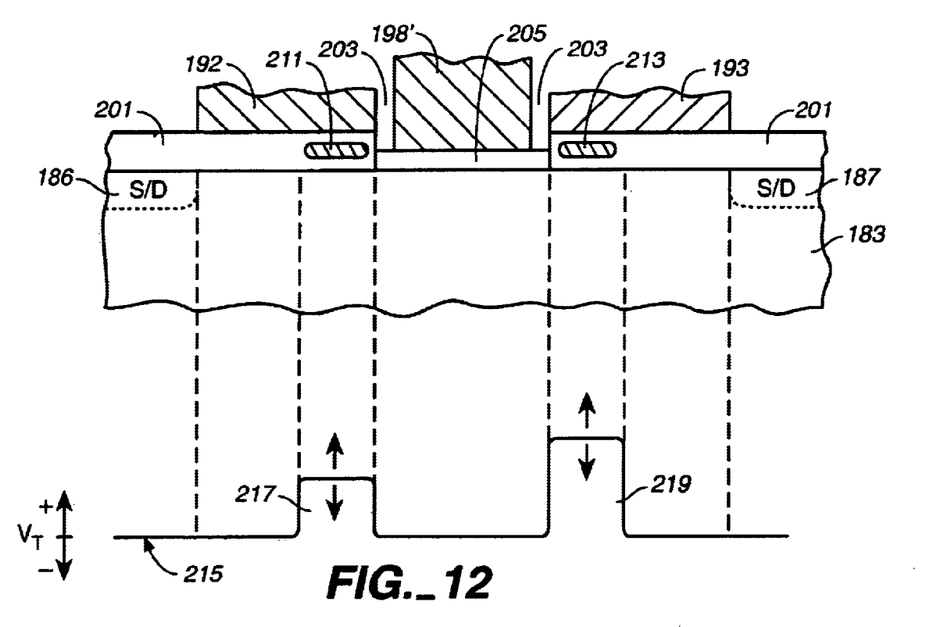
FIG. 12 is an enlarged view of the section of FIG. 11A, showing one memory cell, plus exemplary threshold voltage characteristics across that cell.

FIGS. 10–12 show an array. Source and drain diffusions 185, 186 and 187 are formed in a surface 181 of a semi-conductive substrate 183, and have their lengths extending in the y-direction and are spaced apart in the x-direction. As apparent from the plan view of FIG. 10, conductive steering gates 189, 190, 191, 192, 193 and 194 are oriented in the same way as the diffusions, being positioned on either side of the diffusions in the x-direction. Conductive word lines 197–199 are oriented with lengths extending in the x-direction and are spaced apart in the y-direction. As typical, these conductive lines are made of doped polysilicon material.

As illustrated in the sectional views of FIGS. 11A and 11B, the steering gates 189–194 are positioned over a layer 201 of charge storage material according to one of FIGS. 6A–6B. After the steering gates 189–194 are formed over the charge trapping layer 201, strips of that layer extending in the y-direction are removed between every other of the steering gates in the x-direction. The source and drain regions 185–187 are implanted between the remaining regions between every other steering gate in the x-direction. An oxide layer 203 is formed over the tops and sides of the steering gates 189–194 to isolate those steering gates from the word lines 197–199, and simultaneously formed over the exposed substrate surface 181 to provide gate oxide under the word lines 197–199. An example thickness of the dielectric layer 203 is 200 Angstroms over the doped polysilicon steering gates 189–194, and 150 Angstroms on the substrate surface 181. The portions of the word line 198 shown in FIG. 11A, for example, that are formed immediately over the portion of the oxide layer 203 on the substrate surface 181, serve as the select transistor gates in that row of memory cells.

Adjacent pairs of steering gates on either side of the diffusions 185–187 are preferably electrically connected together at a decoder for the steering gates in order to reduce the complexity of the decoder. One such pair includes steering gates 191 and 192. Such adjacent pairs of steering gates may alternatively be physically merged together by joining them over their intermediate diffusions, as described in several of the Dual Storage Element Cell patents and applications referenced above.

Individual storage elements can be defined to exist in regions of the dielectric trapping layer 201 under one of the steering gates 189–194 where one of the word lines 197–199 crosses, as shown in cross-hatching in the plan view of FIG. 10. There are two such storage elements per memory cell. Each storage element can be operated in two states (binary) in order to store 1 bit per storage element. The storage elements may alternatively be operated to individually store more than two states, such as four states per storage element, in a manner similar to that described in the Dual Storage Element Cell U.S. Pat. No. 6,151,248. The operation of such a dielectric storage memory array is similar to what is described in that patent, one difference being the use of lower voltages on the steering gates since there are no floating gates.

With reference to FIG. 12, an enlarged view of one of the memory cells of FIG. 11A is given. Charge is trapped within the dielectric layer 201 in two regions 211 and 213, adjacent to each side of a select transistor gate 198' that is part of the word line 198, if programmed by the source-side injection technique. If programmed by the channel hot-electron injection technique, on the other hand, these charge regions are located adjacent the source and drain regions 186 and 187 instead. The portions of the dielectric 201 within the memory cell on either side of the select transistor gate 198' and beneath the word line 198 define the two storage elements of the cell that replace the two conductive floating gates of the Dual Storage Element Cell arrays and systems referenced above. The dielectric layer 201, however, can extend beyond these storage elements. In one form, the layer 201 is formed in strips having individual widths that extends in the x-direction between select transistors of memory cells in adjacent columns and lengths that extend in the y-direction across a large number of rows of memory cells. These strips, and the select transistor gate dielectric between them, can be self-aligned with edges of the steering gates, such as the edges of the steering gates 192 and 193 that are shown in FIG. 12.

The effect of charge stored in the regions 211 and 213 of the dielectric 201 is shown by a threshold voltage curve 215 of FIG. 12, similar to the other two examples described above, when programmed by source side injection. A curve portion 217 indicates a variation of the threshold voltage $V_T$ of a portion of the memory cell channel under the charge region 211. Similarly, the effect of the charge region 213 on the channel is indicated by the portion 219 of the curve 215. Each of these regions may be operated in two states (storing one bit per cell) or more than two states (storing more than one bit per cell), as previously described above for the other examples. If programmed by channel hot-electron injection, on the other hand, the curve portions 217 and 219 are positioned further apart from each other, under the alternate locations of the charge trapped in the layer 201 that is mentioned above.

Figure 13:
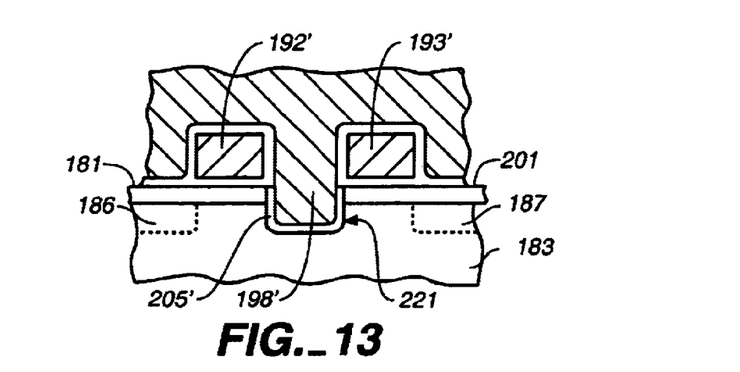
FIG. 13 is a section that shows a modification of the memory cells shown in FIG. 11A.

FIG. 13 shows an optional modification of the memory cell shown in cross-section of FIGS. 11A and 12. The difference is that the select gate portion of the word line 198' extends into a groove or recess 221 in the substrate 183, with the select transistor gate dielectric 205' formed between them along the bottom and walls of the groove 221. This structure increases the length of the channel of the select transistor without taking any additional area across the substrate surface 181.

Although the gates in the foregoing structure are preferably made of doped polysilicon material, other suitable electrically conductive materials may be used in place of one or both of the polysilicon layers described. The second layer, for example, from which the word lines 197–199 are formed, may be a polycide material, which is polysilicon with a conductive refractive metal silicide, such as tungsten, on its top surface in order to increase its conductivity. A polycide material is usually not preferred for the first conductive layer from which the steering gates 189–194 are formed because an oxide grown from a polycide as an interpoly dielectric is of lower quality than that grown from polysilicon. The same considerations apply for the second memory cell example described above. For the first memory cell example, since only one layer of conductive gates is formed, those gates may be a polycide material.

Memory System Operation, in General

Figure 14:
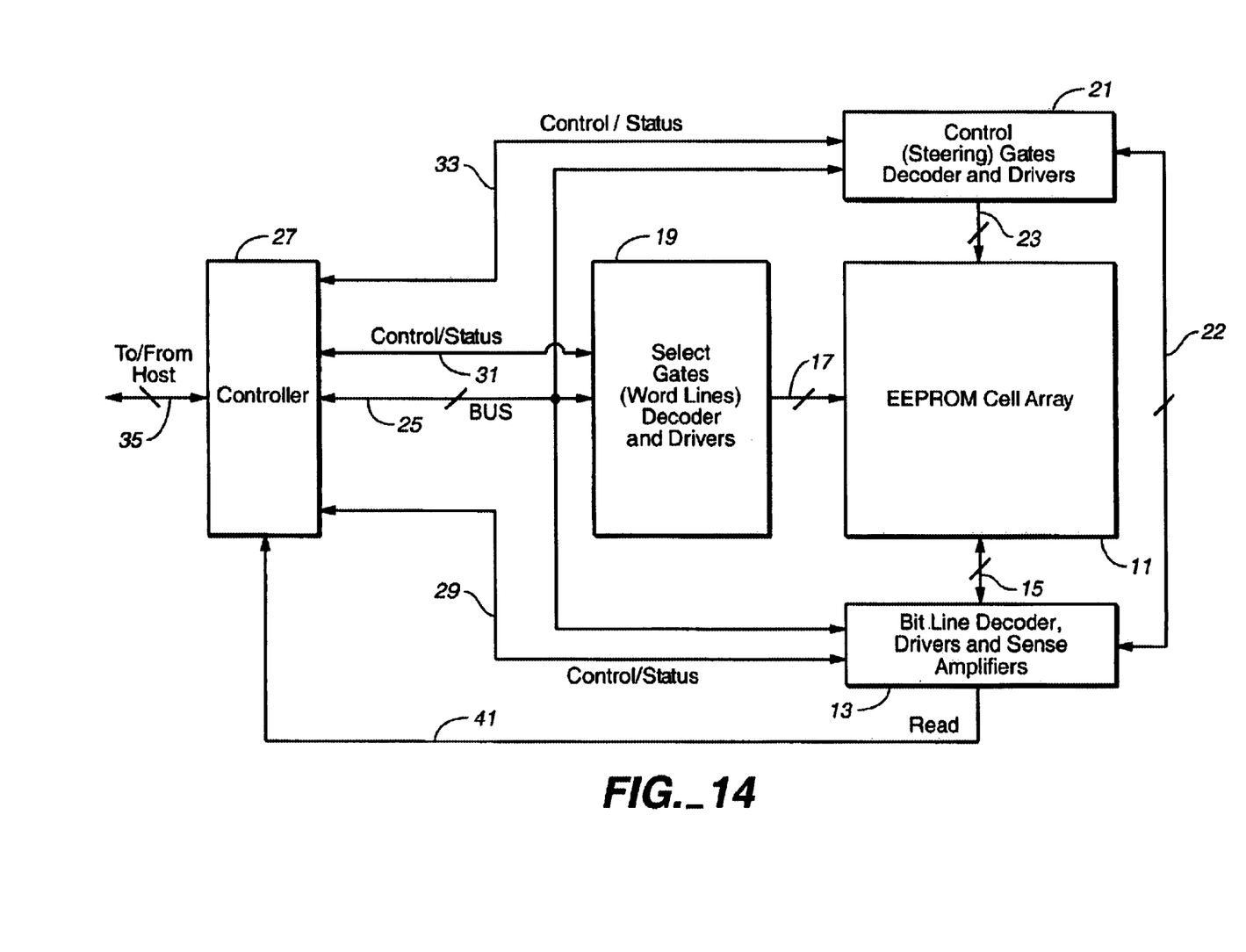
FIG. 14 illustrates in block diagram form a flash EEPROM system in which the memory cell arrays may be implemented.

An example memory system in which the various aspects of the present invention may be implemented is generally illustrated in the block diagram of FIG. 14. This system is most specifically directed to use of the second and third example arrays discussed above with control (steering) gates elongated in the y-direction but also has application to the first example by elimination of the circuits that connect to steering gates.

A large number of individually addressable memory cells 11 are arranged in a regular array of rows and columns, although other physical arrangements of cells are certainly possible. Bit lines, designated herein to extend along columns of the array 11 of cells, are electrically connected with a bit line decoder and driver circuit 13 through lines 15. Word lines, which are designated in this description to extend along rows of the array 11 of cells, are electrically connected through lines 17 to a word line decoder and driver circuit 19. Steering gates, which extend along columns of memory cells in the array 11, are electrically connected to a steering gate decoder and driver circuit 21 through lines 23. The steering gates and/or bit lines may be connected to their respective decoders by techniques described in a co-pending patent application by Harari et al. entitled "Steering Gate and Bit Line Segmentation in Non-Volatile Memories," Ser. No. 09/871,333, filed May 31, 2001, which application is incorporated herein by this reference. Each of the decoders 13, 19 and 21 receives memory cell addresses over a bus 25 from a memory controller 27. The decoder and driving circuits are also connected to the controller 27 over respective control and status signal lines 29, 31 and 33. Voltages applied to the steering gates and bit lines are coordinated through a bus 22 that interconnects the steering gates and bit line decoder and driver circuits 13 and 21.

The controller 27 is connectable through lines 35 to a host device (not shown). The host may be a personal computer, notebook computer, digital camera, audio player, various other hand held electronic devices, and the like. The memory system of FIG. 14 will commonly be implemented in a card according to one of several existing physical and electrical standards, such as one from the PCMCIA, the CompactFlash™ Association, the MMC™ Association, and others. When in a card format, the lines 35 terminate in a connector on the card that interfaces with a complementary connector of the host device. The electrical interface of many cards follows the ATA standard, wherein the memory system appears to the host as if it was a magnetic disk drive. Other memory card interface standards also exist. Alternatively to the card format, memory systems of the type shown in FIG. 14 are permanently embedded in the host device.

The decoder and driver circuits 13, 19 and 21 generate appropriate voltages in their respective lines of the array 11, as addressed over the bus 25, according to control signals in respective control and status lines 29, 31 and 33, to execute programming, reading and erasing functions. Any status signals, including voltage levels and other array parameters, are provided by the array 11 to the controller 27 over the same control and status lines 29, 31 and 33. A plurality of sense amplifiers within the circuit 13 receive current or voltage levels that are indicative of the states of addressed memory cells within the array 11, and provides the controller 27 with information about those states over lines 41 during a read operation. A large number of such sense amplifiers are usually used in order to be able to read the states of a large number of memory cells in parallel. During reading and program operations, one row of cells is typically addressed at a time through the circuits 19 for accessing in the addressed row a number of cells that are selected by the circuits 13 and 21. In one embodiment, during an erase operation, all cells in each of many rows are addressed together as a block for simultaneous erasure.

Operation of a memory system such as illustrated in FIG. 14 is described in patents and pending applications identified above, and in other patents and pending applications assigned to SanDisk Corporation, assignee of the present application. Those of the cited references that describe the structure, processing or operation of a memory system using floating gates as the storage elements will be recognized as being relevant to implementing the systems using dielectric storage elements in place of the floating gates. In addition, U.S. patent application Ser. No. 09/793,370, filed Feb. 26, 2001, describes a data programming method applied to either floating gate or dielectric storage element systems, which application is incorporated herein by this reference.

Other Memory Cell Configurations

Other configurations of memory cell arrays that use conductive floating gates may similarly be modified to replace the floating gates with charge trapping dielectric material, and then to operate each charge storage region of the array either in binary (two states) or multi-states (more than two states). For example, certain configurations described in patents and patent applications referenced above position either of the storage elements or source/drain diffusions in trenches, the trenches either being rectangular in cross-section or V-shaped. In these embodiments, the conductive storage elements can also be replaced with charge trapping dielectric material.

Conclusion

Although the various aspects of the present invention have been described with respect to specific examples thereof, it will be understood that the invention is entitled to protection within the full scope of the appended claims.

It is claimed:

1. A non-volatile memory of a type including an array of memory cells that individually has a charge storing dielectric material positioned between conductive material and a surface of a substrate within at least a portion of a semiconducting channel that extends across the surface between source and drain regions, comprising:

programming means including voltage sources connectable with at least the conductive material and the drains for applying voltages to the gate electrodes and the drains with magnitudes that cause charge to be injected from the substrate into at least two defined regions of the charge storing dielectric that are displaced from each other and from the source and drain regions along the channel of individual addressed ones of the memory cells by source-side injection to levels that adjust thresholds of each of at least two defined portions of their individual channels to one of more than two threshold levels corresponding to data being programmed, thereby to store more than one bit of such data in each of the at least two defined regions of the dielectric storage material of individual ones of the cells, and reading means including voltage sources and sense amplifiers connectable with at least the conductive material, sources and drains of individual cells for monitoring a parameter related to the programmed one of more than two threshold levels of each of the at least two defined portions of the individual memory cell channels such that more than one bit of the data are read from individual defined regions.

2. The memory of claim 1, wherein the charge storage dielectric includes silicon nitride.

3. The memory of claim 1, wherein the charge storage dielectric includes silicon rich silicon dioxide.

4. The memory of claim 1, wherein said more than two defined ranges includes exactly four ranges of charge, thereby to store exactly two bits of the data being programmed in each of the at least two defined regions of the dielectric storage material of individual ones of the cells.

5. The memory of claim 1, wherein said more than two defined ranges includes more than four ranges of charge, thereby to store more than two bits of the data being programmed in each of the at least two defined regions of the dielectric storage material of individual ones of the cells.

6. A non-volatile memory system, comprising:

an array of memory cells, wherein the individual memory cells include:
  a channel having a length extending between source and drain regions within a substrate surface,
  at least first and second conductive gates positioned over first and second portions of the channel along its length, the first and second gates being portions of conductive lines extending in a direction perpendicular to the channel length,
  dielectric charge trapping material sandwiched between both of said at least first and second control gates and said channel, and
  a third conductive gate positioned over a third portion of the channel along its length between the first and second channel portions, the third gate being connected to conductive lines extending in a direction parallel with the channel length, a programming circuit including a source of voltages connectable to at least the drain region and the first and second gates of addressed cells with magnitudes that cause electrons to be transferred from the substrate into at least first and second storage regions of said dielectric material a distance displaced from each other and from said source and drain regions by source-side injection to a storage level in each of the first and second storage regions according to data being programmed, and a reading circuit including sense amplifiers connectable to at least one of the source and drain regions of addressed cells for determining the storage level of each of said at least first and second storage regions by monitoring a parameter related thereto.

7. The memory system of claim 6, wherein said individual memory cells have their at least first and second storage regions formed in a layer of said charge trapping material extending continuously across the length of the channel between the source and drain regions.

8. The memory system of claim 6, wherein the third conductive gate is coupled with the third channel portion through a layer of gate dielectric sandwiched therebetween.

9. The memory system of any one of claims 6–8, wherein the programming circuit includes a source of voltages that causes electrons to be transferred into each of said at least first and second storage regions to one of more than two defined storage levels according to more than one bit of data being stored, and wherein the reading circuit includes sense amplifiers connectable to at least the source or the drain for determining the parameter related to the storage levels of one of more than two defined ranges stored in each of said at least first and second charge storage regions, thereby to read more than onre bit of data from individual charge storage regions.

10. A non-volatile memory, comprising:

elongated source and drain regions formed in a semiconductor substrate with their lengths extending in a first direction thereacross and being spaced apart in a second direction, the first and second directions being perpendicular to each other, thereby defining memory cell channels in the substrate between adjacent source and drain regions, conductive control gates having lengths extending in the first direction, being positioned in the second direction over channel regions immediately adjacent the source and drain regions and being spaced apart in the second direction over an intermediate region of the memory cell channels, dielectric charge storage material positioned at least between the control gates and a surface of the substrate within the memory cell channels in a manner to provide at least two charge storage regions in the dielectric charge storage material under the control gates in the memory cell channels, conductive word lines having lengths extending in the second direction and being spaced apart in the first direction, the word lines further being positioned over the control gates and extending therebetween over the intermediate channel regions, a programming circuit including a source of programming voltages connectable to at least the drain regions, control gates and word lines with magnitudes that add charge by source-side injection to each of the at least two charge storage regions of the dielectric charge storage material to a storage level according to data being stored and with positions displaced from each other and the source and drain regions, and a reading circuit including sense amplifiers connectable to at least the source and drain regions for determining the storage level of the individual charge storage regions by monitoring a parameter related thereto.

11. The non-volatile memory of claim 10, wherein the programming circuit operates to transfer charge into the individual at least two charge storage regions in more than two defined storage levels according to more than one bit of data being stored therein, and wherein the reading circuit operates to determine the storage levels of one of the more than two defined storage levels, thereby to read more than one bit of data from the individual regions of the charge storage elements.

12. The memory system of claim 8, wherein the third conductive gate is recessed into the substrate surface within the third channel portion to a level below the first and second conductive gates.

13. The memory system of claim 10, wherein the word lines are recessed into the substrate surface in the intermediate channel regions and to a level below the control gates.

14. The memory system of claim 10, wherein the at least two charge storage regions include at least one charge storage region under each of the control gates in the memory cells channels.

15. The memory system of claim 11, wherein the at least two charge storage regions include at least one charge storage region under each of the control gates in the memory cell channels.

16. The memory system of claim 8, wherein third control gate forms a select transistor and the layer of dielectric sandwiched between the third control gate and the channel is a gate oxide.

17. The memory of any one of claims 10, 11 or 13, wherein a layer of gate dielectric is positioned between the word lines and the substrate within the intermediate channel regions to form select transistors between the control gates.

18. A non-volatile memory, comprising:

elongated source and drain regions formed in a semiconductor substrate with their lengths extending in a first direction thereacross and being spaced apart in a second direction, the first and second directions being perpendicular to each other, conductive control lines having lengths extending in the first direction and being positioned in the second direction over a first portion of space between neighboring source and drain regions that is immediately adjacent one of the source and drain regions, conductive word lines having lengths extending in the second direction and being spaced apart in the first direction, the word lines further being positioned over the control lines and extending over a second portion of the space between neighboring source and drain regions that is adjacent the first portion, dielectric charge storage material sandwiched between both of the respective control and word lines and a surface of the substrate within the channel regions, a programming circuit including a source of programming voltages connectable to at least the drain regions, control lines and word lines with magnitudes that add charge to each of at least first and second charge storage regions of the dielectric charge storage material under respective ones of the control and word lines in one of at least two defined charge storage levels according to data being stored, and a reading circuit including sense amplifiers connectable to at least one of the source and drain regions for determining said one of at least two defined ranges of charge stored in individual charge storage elements including monitoring a parameter related thereto.

19. The memory of claim 20, wherein the dielectric charge storage material includes a layer of the dielectric charge storage material that extends continuously across the substrate at least between neighboring source and drain regions.

20. The memory of claim 20, wherein the programming circuit operates to transfer charge into each of the first and second charge storage regions with more than two defined charge storage levels according to more than one bit of data being stored, and wherein the reading circuit operates to determine the storage levels of one of more than two defined charge storage levels, thereby to read the more than one bit of data being stored in each of the first and second charge storage regions.

21. A non-volatile memory of a type including an array of memory cells that individually has a charge storing dielectric material positioned between conductive material and a surface of a substrate within a semi-conducting channel that extends across the surface between source and drain regions, comprising:

a programming circuit including sources of voltages that are connectable with at least the conductive material and the drains to supply voltages thereto with magnitudes that cause charge to be injected from the substrate into at least two defined non-overlapping regions of the charge storing dielectric across the channel of individual addressed memory cells by either channel hot-electron injection or source-side injection to levels that adjust thresholds of respective at least two portions of the channels to one of more than two levels according to data being programmed, whereby individual ones of said at least two defined regions of the dielectric storage material can store more than one bit of such data, and a reading circuit including sources of voltages and sense amplifiers connectable with the conductive material, sources and drains of individual addressed memory cells to monitor a parameter related to the programmed one of more than two threshold levels of individual ones of at least two portions of the channels and thereby to read more than one bit of the data from individuals defined regions of the dielectric storage material.

22. The memory of claim 21, wherein the charge storage dielectric includes silicon nitride.

23. The memory of claim 21, wherein the charge storage dielectric includes silicon rich silicon dioxide.

24. The memory of claim 21, wherein said more than two defined ranges includes exactly four ranges of charge.

25. The memory of claim 21, wherein said more than two defined ranges includes more than four ranges of charge.

26. The memory of claim 21, wherein the individual memory cells additionally include the charge storing dielectric material extending continuously along the channel at least between the source and drain regions.

27. The memory of claim 21, wherein the conductive material within the individual cells forms at least two gates positioned over distinct segments of the the channel with the at least two defined non-overlapping regions of the charge storing dielectric thereunder.

28. The memory of claim 27, wherein at least one of the regions of the charge storing dielectric is positioned under each of the at least two gates.

29. The memory of claim 27, wherein the at least two gates include at least two gates formed from conductive lines having lengths extending in a direction perpendicular to the channel.

30. The memory claim 27, wherein the at least two gates include at least one gate formed from a conductive line having a length extending in a direction perpendicular to the channel and at least one gate formed from a conductive line having a length extending in a direction parallel with the channel.

* * * * *